United States Patent [19]

Schrader

[11] 4,306,352
[45] Dec. 22, 1981

[54] FIELD EFFECT TRANSISTOR HAVING AN EXTREMELY SHORT CHANNEL LENGTH

[75] Inventor: Lothar Schrader, Munich, Fed. Rep. of Germany

[73] Assignee: Siemens Aktiengesellschaft, Berlin & Munich, Fed. Rep. of Germany

[21] Appl. No.: 144,896

[22] Filed: Apr. 29, 1980

Related U.S. Application Data

[62] Division of Ser. No. 913,835, Jun. 8, 1978, abandoned.

[30] Foreign Application Priority Data

Jun. 30, 1977 [DE] Fed. Rep. of Germany ....... 2729656

[51] Int. Cl.$^3$ ............................................. H01L 21/26
[52] U.S. Cl. ...................................... 29/571; 29/591; 148/1.5; 148/187; 357/23
[58] Field of Search .................. 29/571, 591; 148/187, 148/1.5; 357/23

[56] References Cited

U.S. PATENT DOCUMENTS

| | | | |
|---|---|---|---|
| 3,454,844 | 7/1969 | Dill | 357/23 |
| 3,660,697 | 5/1972 | Berglund et al. | 357/23 X |
| 3,912,545 | 10/1975 | Armstrong | 357/23 X |
| 3,996,658 | 12/1976 | Takei et al. | 29/571 |
| 4,031,608 | 6/1977 | Togei et al. | 29/571 X |
| 4,037,308 | 7/1977 | Smith | 29/571 |
| 4,084,108 | 4/1978 | Fujimoto | 357/23 X |
| 4,091,278 | 5/1978 | Tchon | 357/24 X |

OTHER PUBLICATIONS

IEEE Journal of Solid-State Circuits, vol. SC-10, No. 5, Oct. 1975, pp. 322-331.

Primary Examiner—G. Ozaki
Attorney, Agent, or Firm—Hill, Van Santen, Steadman, Chiara & Simpson

[57] ABSTRACT

A field effect transistor having an extremely short channel length in which a doped semiconductor layer of one conductivity type has oppositely doped source and drain zones in a surface side thereof. A first gate electrode is separated from the semiconductor layer surface by an insulating layer. The first gate electrode covers the region between the source and drain zones with the exception of a strip-like semiconductor region directly adjoining the source zone. A second gate electrode is provided above the strip-like semiconductor region and is insulated from the first gate electrode by a second insulating layer. The first gate electrode is connected to a bias voltage source and the second gate electrode is arranged to be connected to a control voltage.

5 Claims, 3 Drawing Figures

FIELD EFFECT TRANSISTOR HAVING AN EXTREMELY SHORT CHANNEL LENGTH

This is a division of application Ser. No. 913,835, filed June 8, 1978, now abandoned.

BACKGROUND OF THE INVENTION

The present invention relates to a field effect transistor having an extremely short channel length which possesses a doped semiconductor layer having oppositely doped source and drain zones introduced on the surface side and possessing a first gate electrode separated from the semiconductor surface by an insulating layer.

Transistors of this type are disclosed, for example, in the magazine "IEEE Journal of Solid-State Circuits", Vol. SC-10, No. 5, Oct. 1975, pages 322-331. In order to produce a high "punch-through voltge" which is defined as that value of the drain voltage at which the drain-side depletion zone reaches the source zone, and in order to simultaneously avoid the drain voltage noticeably influencing the transistor internal resistance, the transistors described in this publication are designed as so-called "DMOS field effect transistors", which are to be understood as a MOS-transistor structure which is obtained by a double-diffusion technique. Here the source and drain zones are diffused into the surface of a doped semiconductor layer at a normal distance from one another, although this diffusion process is preceded by another in which, in the source zone, there is formed a diffusion trough which fundamentally strengthens the doping of the semiconductor layer and into which the source zone is then diffused.

In the DMOS-technique, a transistor channel is formed, the main part of which runs between the edge of the diffusion trough and the edge of the drain zone, whereas only a very small part thereof lies between the edge of the diffusion trough and the edge of the source zone embedded in said diffusion trough. This latter part determines the effective channel length of the transistor within which the charge carrier transport is controlled by means of a gate electrode insulated from the semiconductor surface and by a control voltage supplied to said gate electrode, whereas the punch-through voltage assumes values which also occur in MOS-field effect transistors having a channel length corresponding to the source-drain interval.

In the field effect transistors produced in the DMOS-technique, the disadvantage occurs, however, that the effective channel length is dependent upon the course of the double-diffusion process. Since generally speaking a plurality of similar transistors, arranged in particular on a common substrate, are simultaneously subjected to this process, the effective channel lengths and the saturation voltages of all these transistors—the latter assuming equal gate voltages—are identical to one another or at least possess a process-dependent relationship to one another.

SUMMARY OF THE INVENTION

The aim of the invention is to provide a field effect transistor of the type described above, having an extremely short channel length, wherein the above mentioned disadvantages of the known transistors do not occur. This is achieved in accordance with the invention by a design incorporating the features described below.

The field effect transistor in accordance with the present invention is characterized in particular in that its effective channel length is determined by the geometric dimensions of etched regions which can be individually defined for each individual transistor subjected to a common diffusion process. The channel length can also be shorter than the minimum attainable mask dimensions during the production of the transistors. Furthermore, the saturation voltage of the individual field effect transistors which occurs across the drain electrode can be selected and adjusted in a simple manner.

Another fundamental advantage consists in the low capacitance between the input-end gate electrode and the drain zone which facilitates a particularly favorable application of the field effect transistor as an amplifier element in an inverting amplifier stage or as switching element in a logic inverter.

BRIEF DESCRIPTION OF THE DRAWINGS

In the following, the invention will be explained in detail, making reference to a preferred exemplary embodiment which is illustrated in the drawings, in which.

DESCRIPTION OF THE PREFERRED EMBODIMENTS

Figure 1:
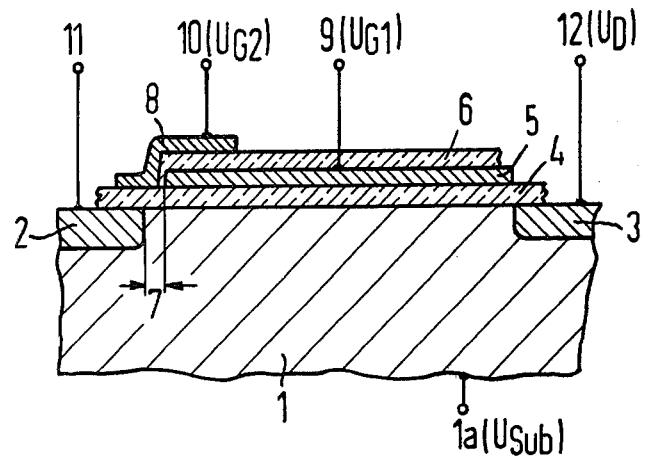
FIG. 1 is a sectional view of the structure of a field effect transistor corresponding to the invention.

The channel zone of the transistor illustrated in FIG. 1 lies on the surface of a p-doped semiconductor layer 1, consisting, for example, of silicon, between the n+-doped source and drain zones 2 and 3. The semiconductor surface is covered by a first insulating layer 4 consisting, for example, of $SiO_2$, above which is arranged a first gate electrode 5. Above the gate electrode is arranged a second insulating layer 6 which entirely covers the electrode 5. The gate electrode 5 is positioned in such a manner that it covers the entire semiconductor area between the source and drain zones 2 and 3 with the exception of a strip-like semiconductor region 7 which directly adjoins the source zone 2. Above the strip-like region 7, and partially above the second insulating layer 6, there is arranged a second gate electrode 8 which is expediently shaped in such a manner that it runs above the region 7 and the source zone 2 in the plane of the gate electrode 5. The first gate electrode 5 is provided with a terminal 9 which is connected to a bias voltage $U_{G1}$. The second gate electrode 8 possesses a terminal 10 via which a gate voltage $U_{G2}$ is supplied. The source zone 2 is also connected via a terminal 11 to reference potential, whereas the drain zone 3 is connected via a terminal 12 to the drain voltage $U_D$. The semiconductor layer 1 is connected via a terminal 1a to a substrate voltage $U_{Sub}$.

When a positive bias voltage $U_{G1}$ is fed to the first gate electrode 5 and a positive drain voltage $U_D$ is connected to the terminal 12, the charge carrier transport between the source zone 2 and the drain zone 3 is controlled in dependence upon the generally positive gate voltage $U_{G2}$ which is fed to the second gate electrode 10. The control is carried out within an effective channel zone the length of which corresponds approximately to the width of the strip-like region 7.

Figure 2:
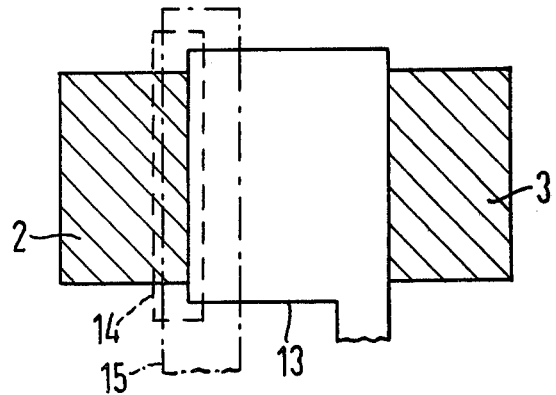
FIG. 2 illustrates a mask layout required for the production of the transistor.

The production of the field effect transistor illustrated in FIG. 1 proceeds in such a manner that following the application of a conductive coating above the insulating layer 4, a mask 13 (FIG. 2) is placed in position and that part of the coating 5 arranged outside the mask is removed. Then the source and drain zones 2 and 3 are introduced into the semiconductor layer 1, in particular, by ion implantation directly outside the left-hand and right-hand edges of the mask 13. In a next step, a mask having an opening 14 is then placed in position, and the right-hand part of this opening leaves exposed an edge strip of the gate electrode 5. In an etching agent which selectively influences the material of the gate electrode 5 is now employed, the aforesaid edge strip of 5 is removed. As can be seen from FIG. 2, the lateral dimensions of the mask opening 4 are greater than the width of the etched away edge strip of the gate electrode 5. As the width of the strip etched away at the edge corresponds to the effective channel length of the field effect transistor, it is thus possible to achieve extremely short channel length, for example, below 1 $\mu$m, without the need for the lateral mask dimensions to be correspondingly small. The channel length of the transistor is determined by the adjustment accuracy with which the mask containing the opening 14 can be placed in position. Subsequently, the insulating layer 6 is applied in such a manner that it completely covers the remaining gate electrode 5 and above said insulating layer there is provided an electrically conductive coating from which the second gate electrode 8 is formed as a result of the positioning of a mask 15 and the etching away of that part of the coating lying outside the mask.

Via the selection of the bias voltage $U_{G1}$, the saturation voltage $U_{DS}$ across the drain terminal 12 can be selected in a simple manner and in fact independently of the controlling gate voltage $U_{G2}$. Expediently, a variable bias voltage $U_{G1}$ is provided in order to be able to match the saturation voltage of the transistor to the particular requirements even during operation.

In accordance with a further development of the principle of the invention, the semiconductor layer 1 is not p-doped as described above, but is p$^-$-doped or 90 -doped, and simultaneously the surface doping of the strip-like semiconductor region 7 is raised to a p-value, for example, by local implantation of acceptor ions. This reduces the interference capacitances across the pn-junctions of the source and drain zones 2 and 3 and increases the punch-through voltages across these junctions without thereby changing the other electrical properties of the transistor.

The raising of the surface doping in the region 7 is preferably carried out following the positioning of the mask provided with the opening 14 and following the etching away of the edge part of the first gate electrode 5, by means of an ion implantation carried out with an ion acceleration which is such that the aforementiond mask simultaneously serves as a doping mask.

The aforementioned semiconductor dopings of the exemplary embodiment can also be modified in such a manner that the conductivity types of the individual semicondutor regions are reversed, in which case operating voltages of the opposite polarity must also be provided. The first gate electrode 5 and/or the second gate electrode 8 expediently consist of strongly doped semiconductor material consisting, in particular, of polysilicon or take the form of a metallic coating composed in particular of aluminum.

Figure 3:
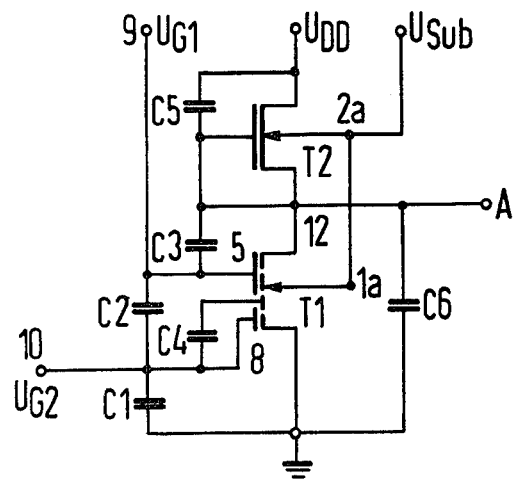
FIG. 3 illustrates the fundamental circuit of a logic inverter, the switching element of which consists of a field effect transistor corresponding to FIG. 1.

FIG. 3 illustrates an inverter stage wherein a transistor corresponding to FIG. 1 is provided as switching transistor T1.

The source terminal 12 of T1 is connected to the drain terminal of a field effect transistor T2 which serves as load element of the inverter circuit, but could also be replaced by another load element, for example, a resistor. The drain terminal 12 of T2 is connected to a supply voltage $U_{DD}$ whereas the source terminal 11 of T2 carries reference potential. The substrate voltage $U_{Sub}$ is fed to T1 via the terminal 1a and to T2 via a terminal 2a. Whereas the gate electrode of T2 is connected to the source-side terminal of T2, the gate electrode 5 of T1 possesses a terminal 9 which is connected to the voltage $U_{G1}$. The controlling gate electrode 8 of T1 possesses a terminal 10 which simultaneously represents the input of the inverter and is fed with the input voltage $U_{G2}$. The circuit output of the inverter, referened A in FIG. 3, corresponds to the drain terminal 12 of T1. C1 indicates the gate-source capacitance between the parts 8 and 2 of T1, C2 signifies the capacitance between the two gate electrodes 5 and 8, C3 signifies the gate-drain capacitance between the parts 5 and 3 of T1, and C5 signifies the gate-drain capacitance of T2. The output capacitance relative to the semiconductor layer 1 is referenced C6. The capacitance referenced C4 represents the capacitance which exists between the circuit input 10 and the circuit output A and which is also referred to as the Miller capacitance. As a result of the low Miller capacitance which can be achieved in a structure corresponding to FIG. 1, when the inverter is pulse driven output-end pulses having very low rise times and very short pulse transit times are achieved. Even when the driving pulse flanks are relatively flat, which is likely, for example, with a preceding driver inverter which commonly operates a plurality of similar inverter stages, no fundamental impairment to the pulse shape or increase in pulse transit times occurs during passage through the inverter. A fundamental factor consists in that the value of C4 is considerably lower than in conventional inverter circuits, even below the saturation voltage of T1. The degree of overlap between the electrodes 5 and 8 is virtually of no significance in respect of the magnitude of the Miller capacitance C4.

It will be apparent to those skilled in the art that many modifications and variations may be effected without departing from the spirit and scope of the novel concepts of the present invention.

I claim as my invention:

1. A process for the production of a field effect transistor in which a doped semiconductor layer is provided with a first, surface-side insulating layer, a first conductive coating is then formed above said first insulating layer, the outline of which is initially defined by selectively etching away edge parts in such a manner that it serves as the channel-side component of a doping mask followed by an ion implantation as a result of which surface-side, oppositely doped source and drain zones are formed, subsequently an etching mask is positioned above said source and drain zones in such a manner that an opening in said mask lies above a narrow source-side edge strip of the first conductive coating and above an edge-side part of said source zone, that the electrode shape of said first gate electrode being then formed by selectively etching away said source-side edge strip of said first conductive coating, then following the application of an insulating layer which covers said first gate electrode upon said insulating layer, and above said source-side edge of said first gate electrode, there is arranged a second, electrically conductive coating from which said second gate electrode is formed.

2. A process for the production of a field effect transistor with an extremely short channel which includes doping a semiconductor layer, applying an insulating layer to a surface of the semiconductor layer, forming a first conductive coating above the insulating layer, selectively etching away edge parts of the conductive coating in such a manner that it serves as the channel-side component of a doping mask followed by an ion implantation as a result of which oppositely doped source and drain regions are formed in the surface of the semiconductor layer, spaced apart from one another, and below the edges of the first conductive coating, subsequently providing an etching mask above the source and drain zones in such a manner that an opening in said mask lies above a narrow source-side edge strip of the first conductive coating, forming the electrode shape of the first gate electrode by selectively etching away the source-side edge strip of the first conductive coating, forming a second insulating layer which covers the first gate electrode upon the first insulating layer, and then forming a second, electrically conductive coating upon which a second gate electrode is formed above the short channel between the source and the first gate electrode, overlapping both the source and the first gate electrode.

3. A method of forming a field effect transistor having an extremely short channel which includes the steps of: selectively doping a semiconductor substrate, applying an insulating coating over a portion of a surface of the doped substrate, applying a conductive coating above the insulating layer, positioning a selectively shaped mask over the conductive coating and removing that portion of the conductive coating outside of the selectively shaped mask, forming spaced apart source and drain regions in the semiconductor substrate, at the surface thereof, at the edges of the previously positioned mask, positioning a second mask with a slot formed therein such that the slot exposes a selective amount of the edge of the conducting layer adjacent the source region, removing the exposed portion of the edge of the conducting layer thereby forming an extremely short channel between the source and the remaining edge of the conducting layer, forming a second insulating layer above the conducting layer, forming a second conducting layer on the second insulating layer above the short channel.

4. The method according to claim 3 wherein the source and drain regions are formed by ion implantation.

5. The method according to claim 3 wherein the width of the strip etched away at the edge of the first conducting layer corresponds to the effective channel length of the field effect transistor.

* * * * *